United States Patent [19]

Ruffoni

[11] Patent Number: 5,151,222
[45] Date of Patent: Sep. 29, 1992

[54] FOAM ABSORBER

[75] Inventor: John M. Ruffoni, San Diego, Calif.

[73] Assignee: McDonnell Douglas Corporation, Long Beach, Calif.

[21] Appl. No.: 749,993

[22] Filed: Aug. 26, 1991

[51] Int. Cl.$^5$ .............................. C08J 9/38; C08J 9/40; C08J 9/42

[52] U.S. Cl. ...................................... 252/511; 521/52; 521/54; 521/82; 521/92; 521/99; 521/123; 521/135; 521/78; 252/503; 252/508; 252/514

[58] Field of Search .............. 252/503, 508, 511, 514; 521/52, 54, 135, 78

[56] References Cited

U.S. PATENT DOCUMENTS

| | | | |
|---|---|---|---|
| 2,514,141 | 7/1950 | Phillips | 521/138 |
| 4,929,969 | 5/1990 | Morris | 521/52 |
| 4,980,004 | 10/1990 | Hill | 521/54 |
| 4,985,467 | 1/1991 | Kelly et al. | 521/52 |
| 5,034,422 | 7/1991 | Triolo et al. | 521/52 |

*Primary Examiner*—Morton Foelak
*Attorney, Agent, or Firm*—Max Geldin

[57] ABSTRACT

A foam absorber having electromagnetic energy attenuation characteristics comprising an open cell reticulated polyurethane foam impregnated with a conductive ink applied to a surface of the foam substrate. The conductive ink is applied as by spraying to a surface of the foam, coating such surface and gradiently loading the foam with the ink by penetration of the ink in gradually decreasing amount into the foam to a final depth therein. The conductive ink is comprised of an epoxy resin carrier and a combination of carbon and a metal such as silver, copper or nickel, preferably silver. The ink is applied as a curable mixture containing a solvent, to the foam substrate, the solvent is evaporated following coating and penetration of the ink into the foam, and the epoxy carrier of the ink in the foam substrate is cured.

6 Claims, 1 Drawing Sheet

FOAM ABSORBER

BACKGROUND OF THE INVENTION

This invention relates to attenuation of electromagnetic energy, and is particularly directed to a foam absorber which is effective for attenuating electromagnetic energy especially for radar attenuation, over a broad range of frequencies.

The use of an open-cell foam substrate having a filler forming a conductive loading gradient as a light-weight broadband microwave absorber is known. However, when such prior art absorbers are flexed in many instances the elasticity of the foam is reduced to a point where upon continuing flexure, the loading material fractures and the conductive gradient is adversely affected. This is due in large measure to the fact that the conductive gradient loading material has a different flexibility from that of the foam and does not bend with the foam substrate upon flexure thereof.

In addition, prior art foam absorbers often suffer from the problem of improper distribution of the conductive ink filler material in the gradiently loaded substrate.

Accordingly, one object of the invention is the provision of an improved foam absorber for attenuation of electromagnetic energy.

Another object is the provision of an open cell foam absorber gradiently loaded with a conductive material which has a flexibility which closely matches the flexibility of the foam substrate.

A still further object is to provide a foam absorber having a dielectric gradient which attenuates electromagnetic energy or radar over a broad range of frequencies.

Yet another object is the provision of a foam absorber for attenuation of electromagnetic energy, having improved distribution of the gradiently loaded dielectric material within the foam substrate.

Still another object is to provide procedure for producing the improved foam absorber of the invention.

SUMMARY OF THE INVENTION

The above objects are achieved according to the invention by the provision of a foam material having electromagnetic energy attenuation characteristics which comprises an open cell reticulated polyurethane foam substrate impregnated with a specific conductive ink applied to a surface of the foam substrate and gradiently loading the foam substrate from such surface with the ink to a desired depth within the substrate to provide a dielectric gradient therein. The ink is comprised of an epoxy resin carrier containing a conductive material consisting essentially of a combination of carbon and a metal such as silver, copper or nickel, particularly silver. Using this technique, a dielectric gradient is achieved which attenuates electromagnetic energy over a broad range of frequencies.

If desired, the foam substrate can be initially treated with a fire retardent material. Further, various skin materials such as cloth can be bonded as by adhesive to the treated surface of the foam substrate as an environment barrier.

The foam absorber of the invention can be readily flexed over a long period of use without damage to the flexible loading material. Further, the foam absorber of the invention can be provided with a more uniform distribution of the gradiently loaded ink from the surface to which the conductive ink is initially applied to the final depth of penetration of the ink within the foam substrate.

The foam product of the invention can be made thinner and lighter than conventional foam absorbers, and is more durable and reproducible than existing reticulated foam absorbers. The foam absorber product of the invention retains efficient performance characteristics upon mechanical cycling, and is durable and has increased chemical resistance.

DETAILED DESCRIPTION OF THE INVENTION AND PREFERRED EMBODIMENTS

Figure 1:
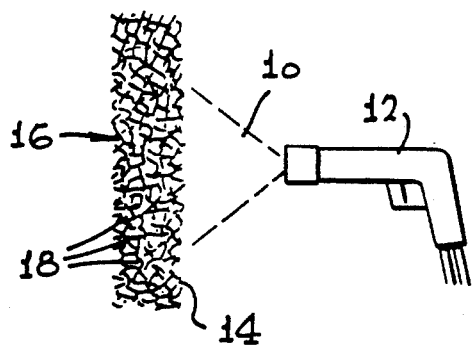
FIG. 1 illustrates the process for applying a conductive ink onto a surface of a reticulated foam to provide a gradient loading onto the foam substrate.

Referring to FIG. 1 of the drawing, a conductive ink according to the invention, and described more fully below, in the form of a liquid medium, is sprayed, as indicated at 10, from a spray gun 12 onto the front surface 14 of a reticulated foam substrate 16.

The reticulated foam substrate 16 employed according to the invention is a light weight, flexible, reticulated polyurethane foam formed by exploding bubbles of the foam material, using large open cells 18 within a skeleton structure of fibers, similar to a fiber mat. The reticulated cell foam substrate functions as a filtering medium for the conductive ink which is sprayed onto the front surface 14 of the foam substrate. The foam substrate can be a polyether polyurethane foam or a polyester polyurethane foam, preferably the latter. The porosity of the reticulared polyurethane foam substrate generally ranges from about 3 to about 20 ppi (pores per inch).

The ink system applied to the open cell polyurethane foam substrate is in the form of a conductive paint comprised of a carrier in a solvent and loaded with a conductive medium. The resin carrier employed is a flexible epoxy which upon curing has essentially the same flexibility characteristics as the polyurethane foam substrate, that is the flexibililty of the cured epoxy closely matches the flexibility of the polyurethane foam. Other resin carriers for the ink such as acrylics and polychloroprene rubber have been tried but have not been found to have the advantageous flexibililty properties of the flexible epoxies.

The solvent medium for the ink composition can be any suitable organic solvent such as methyl ethyl ketone (MEK), toluene, and a "Cellosolve" such as butyl Cellosolve acetate, a trademark of Union Carbide Corporation for ethylene glycol monobutyl ether acetate.

The conductive material or filler of the ink composition is a combination of carbon, e.g. graphite powder, and a metal which can be silver, copper or nickel. It has been found that silver is the preferred metal for this purpose. The range of proportions of carbon to metal in the ink system can range from about 0.5 to about 2 parts of carbon, to about 1 part of the metal, by weight. It has been found that a ratio of carbon to metal, particlularly silver, of about 1.7 to about 1 part, by weight, is particularly preferred. The carbon component decreases the conductivity of the ink and confers dielectric properties on the ink, the greater the amount of carbon, the greater the dielectric characteristics of the ink composition.

The ink composition or filler material, that is the above combination of carbon and metal, particularly silver, both in particlate or powder form, is blended into the solvent medium containing the epoxy resin carrier. The ink system containing the carbon and metal particles and epoxy resin in homogeneous suspension can contain a total of about 4 to about 35% solids, e.g. about 20% of a combination of carbon, metal, e.g. silver, and epoxy resin, by weight.

As previously noted, the ink system is preferably applied like a spray paint to the reticulated polyurethane foam substrate with an atomizing spray gun. The ink spray can be applied in one or several passes to the foam substrate to increase the total amount of ink composition coated on and impregnated into the foam.

The ink system or paint thus applied to the foam substrate 16, as shown in FIG. 1, forms a surface coating on the front surface 14 of the foam substrate. There is a minor solvation of the epoxy carrier resin in the substrate but such solvation is negligible. As the ink is continued to be applied to the foam substrate, the paint penetrates and filters through the foam in a gradually decreasing amount from the coated surface 14 of the substrate, to a final depth within the foam. The conductive ink can penetrate or impregnate into the foam substrate to a thickness ranging from about 0.1 to about 4 inches. The amount or density of the conductive ink becomes gradually less as the ink penetrates deeper into the foam substrate, gradiently loading the foam substrate in gradually decreasing amount from the coated surface, providing a dielectric gradient from the coated surface to a final depth in the foam.

The epoxy resin carrier is then cured by curing agents which are present in the solvent solution of the epoxy resin carrier, either at normal or elevated temperature. Upon curing, a foam absorber having a dielectric gradient layer of the aforementioned thickness, and which attenuates electromagnetic energy over a broad range of frequencies, is achieved. The attentuation range is dependent upon the substrate thickness.

The employment of a flexible epoxy as carrier for the ink results in a cured epoxy carrier which has flexibility characteristics closely matching those of the polyurethane foam substrate, which avoids cracking or disintegration during compression and expansion of the foam substrate in use. In addition, a uniform distribution of conductive ink is achieved from the surface of the foam to which the ink is initially applied and at each layer of depth down to the lowest depth of penetration of the ink within the foam substrate.

Figure 2:
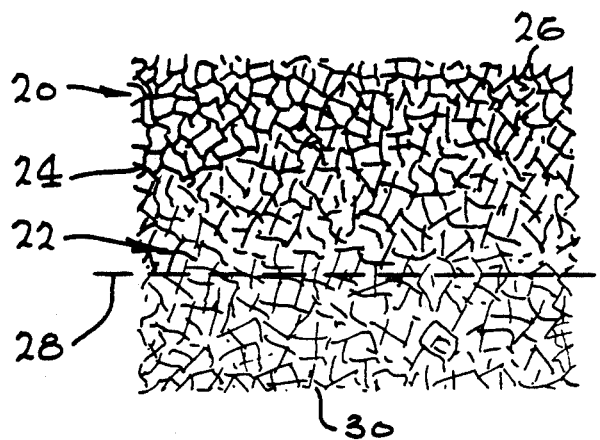
FIG. 2 illustrates the resulting foam absorber of the invention, produced by the process illustrated in FIG. 1.

The foam absorber of the invention is illustrated at 20 in FIG. 2, wherein numeral 22 is the foam substrate and 24 is the ink filler providing the dielectric gradient within the substrate which is dielectrically graded from the coated or black side 26 of the foam substrate, with the ink filler filtering through the foam from the coated side 26, in gradually decreasing amount down to the lowest depth of penetration indicated by dotted line 28.

If desired, to improve the foam absorber performance, as previously noted, several passes or applications of the conductive ink can be applied to the foam substrate. Such additional applications or passes can be accomplished using the same ink system, or a different ink formulation, if desired.

The foam absorber of the invention is designed to absorb as much of the electromagnetic energy as possible and at the lowest frequency possible, both in band width and in magnitude. Performances have been obtained employing the foam absorber of the invention containing an ink system formed of a combination of carbon and silver, on the order of 20 dB from 2.5 to 18 GHz, and in excess of 30 dB from 4 to 18 GHz.

If desired, the polyurethane foam substrate can be treated with a fire retardent material such as suitable phosphates or antimony trioxide, prior to treatment with the ink system.

Further, the volatile organic content of the ink system can be reduced for environmental concerns, by employing an aqueous ink system.

To protect the foam absorber from environmental conditions, such as protection from water and sunlight, a variety of skinning materials can be applied to the coated surface of the foam absorber. Thus, cloth, fabric sheet or plastic can be bonded, as by a suitable adhesive, or by ultrasonics, to the ink coated surface at 26 of the foam absorber 20 in FIG. 2, and/or to the opposite surface 30 of the foam absorber.

The foam absorber of the invention can be employed for any application to attenuate electromagnetic or radar energy, e.g. in aircraft components of aircraft where it is desired to avoid radar detection, or in applications for reducing background noise levels, e.g. from an antenna.

The following are examples of practice of the invention:

EXAMPLE 1

A spray material in the form of a conductive ink is prepared having the following composition:

| Composition A | |
| --- | --- |
| Components | Amounts |
| CT-5079-4 | 150 grams |
| CT-5030 | 37.5 grams |
| MEK | 2,000 ml |
| toluene | 1,750 ml |
| B-97 curing agent | 4.4 grams |

CT-5079-4 is a composition containing 25-30 wt. percent carbon, the remainder being epoxy resin and butyl Cellosolve acetate as solvent, and marketed by Emerson & Cuming of Woburn, Mass.

CT-5030 is a composition containing 50-70 wt. percent silver, the remainder being epoxy resin and butyl Cellosolve acetate, also marketed by Emerson and Cuming.

B-97 curing agent is also marketed by Emerson and Cuming, and is believed to be an amidazole.

The total solids content of Composition A is about 5% by weight.

Composition A was homogenized in a colloid mill. The resulting ink composition was sprayed on the front side of a 13"×13" square piece of 10 ppi polyester polyurethane reticulated open cell foam having a thickness of about 1.5", as illustrated in FIG. 1 of the drawing. The spray nozzle was spaced about 6-8" from the front surface of the foam and formed a spray having about a 4" fan width. The spray was applied at a fluid pressure of about 15 psi.

The resulting foam coated and penetrated with the conductive ink composition was dried to remove solvent, and then placed in an oven and heated at about 200°-250° F. for about one half hour to cure the epoxy resin carrier of the conductive ink filler. The cured foam having a conductive gradient extending from the coated front side of the foam internally thereof to a final depth within the foam body, is as illustrated in FIG. 2.

When such cured foam material was tested for electromagnetic energy attenuation, the attenuation was 20 dB at 8 to 18 GHz.

EXAMPLE 2

The procedure of Example 1 is followed except that the foam is first treated with antimony trioxide to render it fire retardant.

Substantially the same electromagnetic energy attenuation results as in Example 1 are obtained.

EXAMPLE 3

The procedure of Example 1 is followed except that after preparation of the cured foam material, containing the gradiently loaded ink, a Gortex fabric sheet, a trademarked material of W. L. Gore and Associates, Inc. of Flagstaff, Ariz., is bonded by a latex adhesive to the front coated surface of the foam substrate.

After exposure to substantial water treatment simulating use under such environmental conditions, electromagnetic energy attenuation results comparable to Example 1 are obtained.

EXAMPLE 4

The procedure of Example 1 can be carried out using in place of the silver, an equal amount of copper or nickel.

EXAMPLE 5

The procedure of Example 1 is carried out using a polyester polyurethane foam substrate having a porosity of 15 ppi. In this case, however, the foam substrate is subjected to 5 successive spray treatments or 5 passes of ink Composition A, and the treated foam substrate is then dried and cured as in Example 1.

The procedure of Example 1 is also carried out using a polyester polyurethane foam substrate having a porosity of 5 ppi. Here the foam substrate is subjected to 15 successive spray treatments or 15 passes of ink Composition A, and the treated foam substrate then dried and cured as in Example 1.

Figure 3:
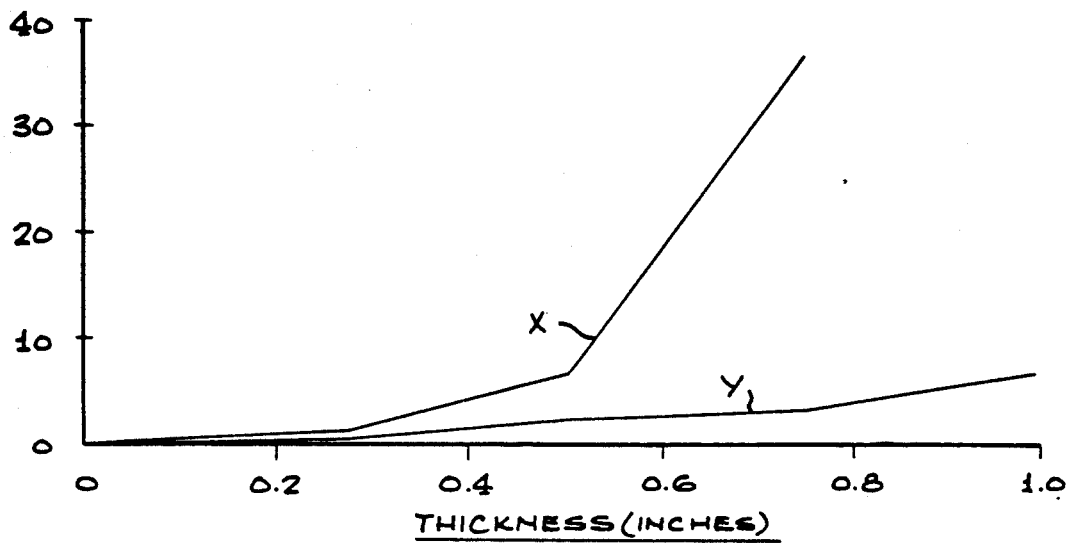
FIG. 3 is a plot illustrating the dielectric gradient profile for two foam substrates treated according to the invention.

FIG. 3 is a plot illustrating the dielectric gradient profile for each of the two foam substrates noted above, treated with the conductive ink Composition A in the manner described above. Plot X represents the dielectric gradient for the 15 ppi substrate subjected to 5 passes of conductive ink treatment, and plot Y the dielectric gradient for the 5 ppi substrate subjected to 15 passes of the conductive ink treatment.

Plots X and Y clearly show an increase in dielectric gradient or a decrease in electrical conductivity from the coated side of the foam, indicated at 0 thickness on the plot, the location of greatest electrical conductivity, and gradually reduced conductivity as the ink penetrates the thickness of the foam substrate, as shown by greater values of ohms/square for each of plots X and Y at increasing penetrating thicknesses of the ink in each foam substrate. The term "ohms/square" as a measure of foam resistivity is defined as the bulk resistivity of the foam substrate which is expressed in ohms x cm divided by the thickness in cm.

From the foregoing it is seen that a foam absorber is provided according to the invention which is effective for absorbing electromagnetic or radar energy, and has a variety of features and advantages noted above, including durability and flexibility over a broad range of frequencies, and chemical resistance.

Since various further modifications of the invention will occur to those skilled in the art, the invention is not to be taken as limited except by the scope of the appended claims.

What is claimed is:

1. A process for producing a foam material having electromagnetic energy attenuation characteristics which comprises
   providing a solution of a curable epoxy resin composition in a solvent,
   adding carbon and a metal selected from the group consisting of silver, copper and nickel to said resin composition,
   spraying the resulting mixture onto a surface of an open cell reticulated polyurethane foam substrate, causing said mixture to coat said surface of the foam substrate and to penetrate and filter through said foam substrate in gradually decreasing amount from said coated surface to a final depth in said foam to provide a dielectric gradient layer, and
   curing said epoxy resin to form a carrier for said carbon and metal of said dielectric gradient, said cured epoxy carrier having substantially the same flexibility characteristics as said polyurethane foam.

2. The process of claim 1, wherein the ratio of carbon to metal in said mixture ranges from about 0.5 to about 2 parts of carbon to about 1 part of metal, by weight.

3. The process of claim 1, wherein the solids content of said mixture ranges from about 4 to about 35%, by weight.

4. The process of claim 1, wherein said metal is silver and the weight ratio of carbon to silver is about 1.7 to about 1.

5. The process of claim 1, said reticulated polyurethane foam substrate being a polyester polyurethane foam having a porosity ranging from about 3 to about 20 ppi.

6. The process of claim 1, the thickness of the dielectric gradient layer in said foam produced by the cured epoxy carrier containing said carbon and metal ranging from about 0.1 to about 4 inches.

* * * * *